US012790684B2

(12) United States Patent
Zhang et al.

(10) Patent No.: US 12,790,684 B2
(45) Date of Patent: Nov. 10, 2026

(54) SEMICONDUCTOR DEPOSITION METHOD

(71) Applicant: United Semiconductor (Xiamen) Co., Ltd., Xiamen (CN)

(72) Inventors: Qiang Zhang, Shamen City (CN); Xijun Guo, Singapore (SG); Min-Hsien Chen, Taichung City (TW); Ching-Ning Yang, Kaohsiung City (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 816 days.

(21) Appl. No.: 17/340,128

(22) Filed: Jun. 7, 2021

(65) Prior Publication Data

US 2022/0356568 A1 Nov. 10, 2022

(30) Foreign Application Priority Data

May 7, 2021 (CN) ......................... 202110493223.6

(51) Int. Cl.
*C23C 16/44* (2006.01)
*C23C 16/455* (2006.01)
*H10P 72/00* (2026.01)

(52) U.S. Cl.
CPC ........ *C23C 16/4405* (2013.01); *C23C 16/455* (2013.01); *H10P 72/0406* (2026.01)

(58) Field of Classification Search
CPC .............. C23C 16/4405; C23C 16/455; H01L 21/67028
USPC .......................................................... 438/758
See application file for complete search history.

(56) References Cited

U.S. PATENT DOCUMENTS 5,647,945 A * 7/1997 Matsuse .............. C23C 16/4557 438/935
2003/0037802 A1 2/2003 Nakahara
2003/0111012 A1* 6/2003 Takeshima ........ C23C 16/45593 118/715

(Continued)

FOREIGN PATENT DOCUMENTS

CN 102703882 A 10/2012
CN 102747338 A 10/2012
CN 109423621 A 3/2019

OTHER PUBLICATIONS

English Machine Translation CN 109423621 (Year: 2019).*
English Machine Translation CN 102747338 (Year: 2012).*

*Primary Examiner* — Dzung Tran
(74) *Attorney, Agent, or Firm* — Winston Hsu

(57) ABSTRACT

The invention provides an improved semiconductor deposition method, which comprises providing a deposition machine, the deposition machine includes a chamber connected with a pipeline, putting a first wafer into the chamber, and performing a pipeline cleaning step, the pipeline cleaning step includes: cutting off the path between the pipeline and the chamber by turning off a plurality of valve switches, and introducing a gas from the pipeline to move along a first path of the pipeline. Then, a deposition step is performed on the first wafer to deposit a first material layer on the surface of the first wafer, the deposition step includes opening a plurality of valve switches to communicate the path between the pipeline and the chamber, and introducing the gas into the chamber along a second path of the pipeline.

17 Claims, 5 Drawing Sheets

(56) References Cited

U.S. PATENT DOCUMENTS

| | | | | |
|---|---|---|---|---|
| 2004/0123879 | A1* | 7/2004 | Yim | C23C 16/4405 134/1.1 |
| 2005/0109399 | A1* | 5/2005 | Wodjenski | F17C 13/04 137/240 |
| 2007/0237895 | A1* | 10/2007 | Suzuki | C23C 16/16 700/121 |
| 2008/0023084 | A1* | 1/2008 | Chang | F17D 1/086 137/596.13 |
| 2008/0026148 | A1 | 1/2008 | Tominaga | |

* cited by examiner

SEMICONDUCTOR DEPOSITION METHOD

BACKGROUND OF THE INVENTION

1. Field of the Invention

The present invention relates to the field of semiconductor manufacturing process, in particular to an improved semiconductor deposition method, which can reduce the probability of impurities accumulating in the pipe wall during the deposition step.

2. Description of the Prior Art

Deposition is a common step in semiconductor manufacturing. The deposition step can form various material layers on the substrate or target layer to form various semiconductor stacked structures.

Chemical vapor deposition (CVD) is to introduce the gas containing material components into the chamber through the pipeline to deposit the material on the target substrate. However, when the gas containing material components passes through the pipeline, material particles or impurities may gradually deposit in the pipe wall. After a period of accumulation, the material particles or impurities deposited on the pipe wall may fall off, resulting in product yield defects or uneven deposited materials.

Therefore, there is a need for a method to reduce the probability of the above problems and improve the yield of semiconductor manufacturing.

SUMMARY OF THE INVENTION

The invention provides an improved semiconductor deposition method, which comprises providing a deposition machine, the deposition machine comprises a chamber connected with a pipeline, placing a first wafer into the chamber, and performing a pipeline cleaning step, the pipeline cleaning step comprises: cutting off the path between the pipeline and the chamber by closing a plurality of valve switches, and introducing a gas from the pipeline to move along a first path of the pipeline. Then, a deposition step is performed on the first wafer to deposit a first material layer on the surface of the first wafer, the deposition step includes opening a plurality of valve switches to connect the path between the pipeline and the chamber, and introducing the gas into the chamber along a second path of the pipeline.

In the prior art, if the deposition step is not carried out, no gas passes through the pipeline, which leads to the problem that material particles in the gas are easily deposited in the pipe wall, causing accumulation pollution and the like. The invention is characterized in that the carrier gas containing no material particles continuously flows through the pipeline by switching the valve switch in the process spare times except the deposition step (including the pre-deposition step, pausing the deposition step by adjusting parameters, or changing wafers), so that the material particles are not easily deposited in the pipeline, and the cleaning times can be saved. The method can improve the process yield and the process efficiency, and is also compatible with the existing process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
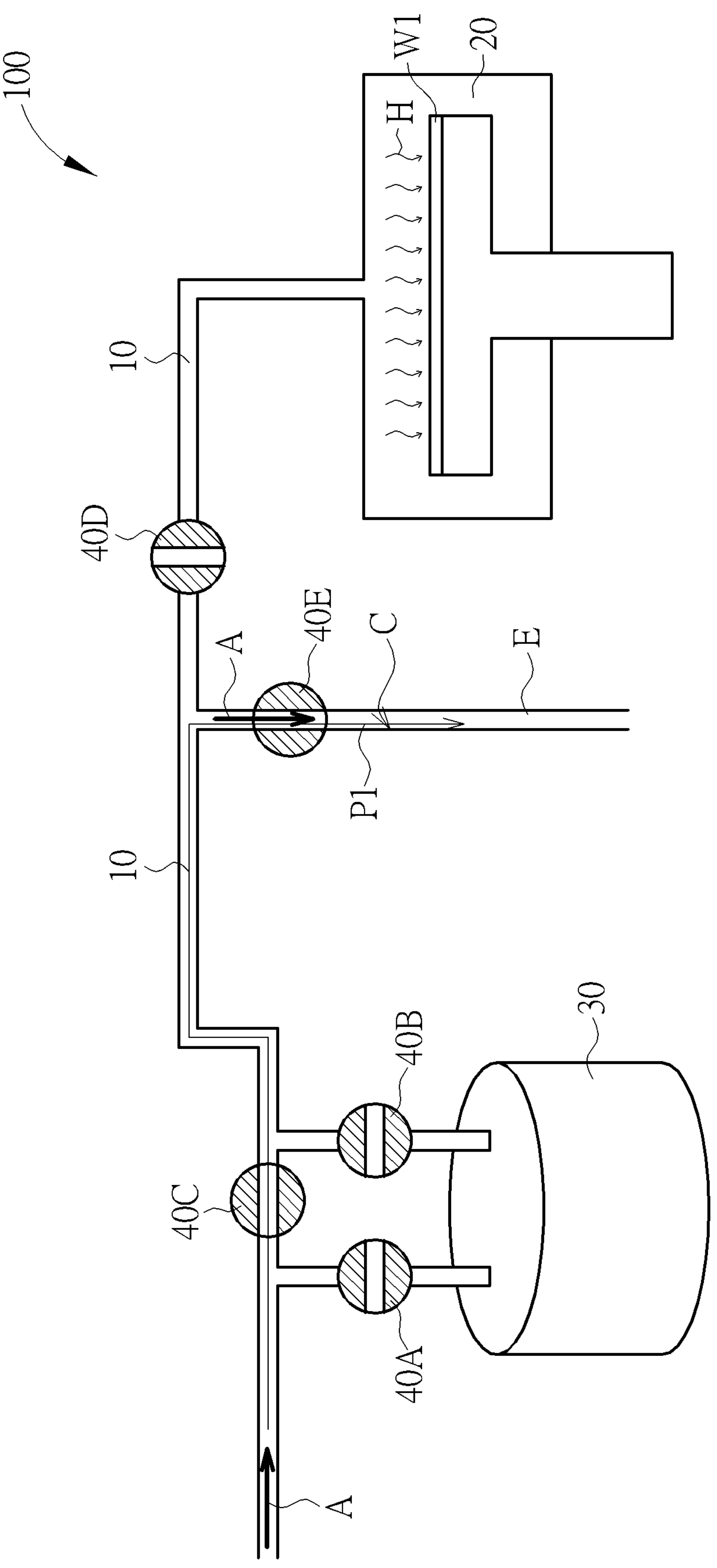
FIG. 1 is a schematic diagram showing a pipeline cleaning step in a pre-deposition step according to a first preferred embodiment of the present invention.
Figure 2:
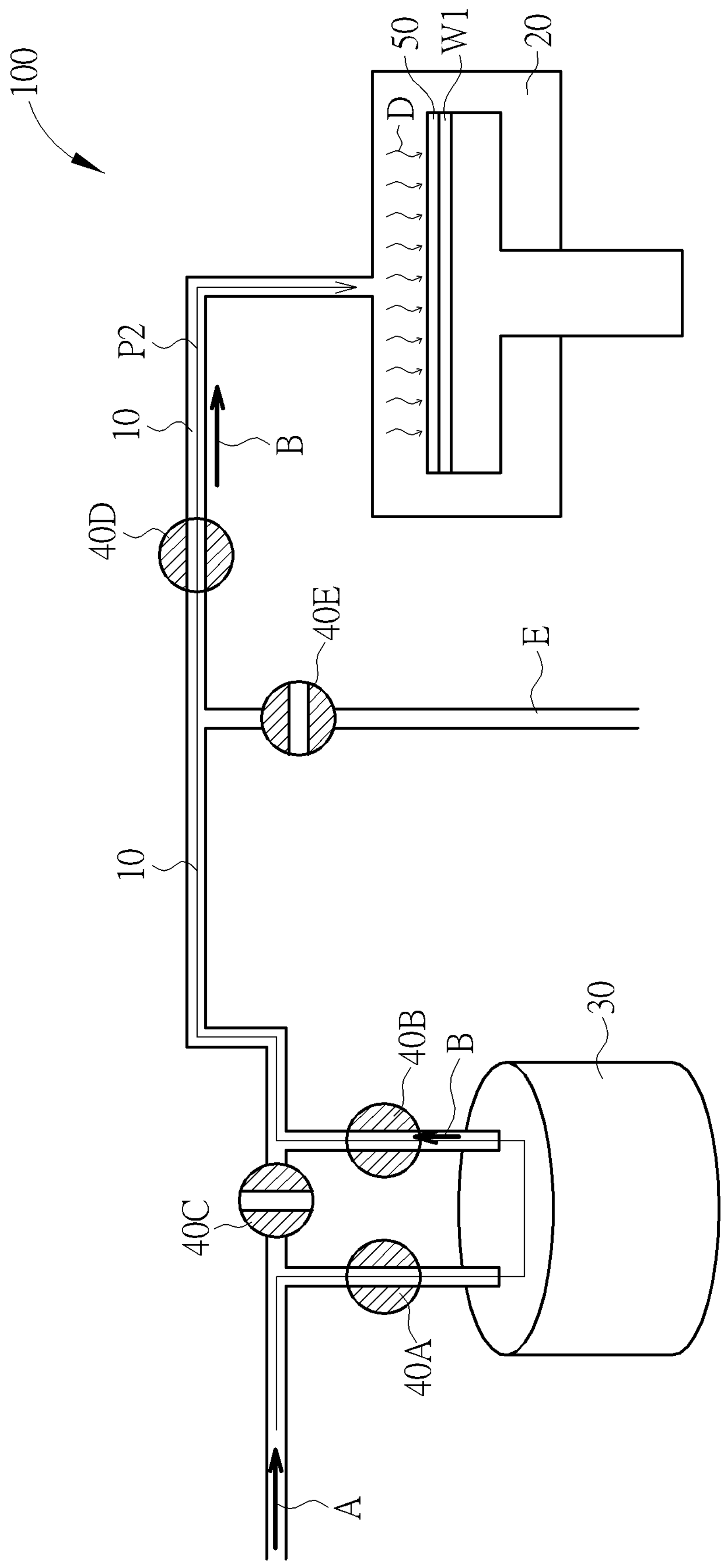
FIG. 2 is a schematic diagram showing a deposition step according to the first preferred embodiment of the present invention.

FIG. 1 is a schematic diagram showing a pipeline cleaning step in a pre-deposition step according to the first preferred embodiment of the present invention, and FIG. 2 is a schematic diagram showing a deposition step according to the first preferred embodiment of the present invention. Please refer to FIG. 1 and FIG. 2 together. Firstly, the invention provides a deposition machine 100, which mainly comprises a pipeline 10 and a chamber 20 connected with the pipeline 10, the chamber 20 is used for placing a wafer (such as the first wafer W1 in FIG. 1) therein, and gas containing material components is introduced into the chamber 20 through the pipeline 10 to deposit a material layer on the first wafer W1.

Generally, the carrier gas A enters from the inlet of the pipeline 10, passes through a material tank 30, and then reaches the chamber 20, the material tank 30 contains material components to be deposited (which may also be in a gas state), so when the carrier gas A passes through the material tank 30, it will become deposition gas B containing material components, and the deposition gas B enters the chamber 20 to deposit a material layer on the first wafer W1.

However, because the deposition gas B contains material components or the material particles may be deposited on the inner wall of the pipeline when passing through the pipeline 10, which may cause pollution, uneven deposition, partial blockage and other issues.

In the conventional technology, it is necessary to pauses the operation of the deposition machine and clean the pipeline at regular intervals to avoid the above problems. However, the cleaning step will also lengthen the total process time, which will adversely affect the process efficiency.

Therefore, the present invention provides an improved semiconductor deposition method. As shown in FIG. 1, after the first wafer W1 is placed in the deposition machine 100, some other steps (such as vacuumizing, heating, etc.) before the deposition step are started, and the pipeline cleaning step is performed at the same time. The above steps such as heating or vacuumizing can be called pre-deposition step in the present invention, which represents other steps before the deposition step. In the prior art, when the pre-deposition step is carried out, gas does not need to pass through the pipeline, so material particles are more likely to deposit on the inner wall of the pipeline. In the present invention, please refer to FIG. 1, during the pre-deposition step (taking the heating step H as an example), by controlling a plurality of valve switches (such as valve switches 40A, 40B, 40C, 40D, 40E), the communication path between the pipeline 10 and the chamber 20 is isolated, and the carrier gas A travels along a first path P1, the first path P1 does not pass through the material tank 30 and the chamber 20, but flows out an outlet of the pipeline 10. That is, during the pre-deposition step, the carrier gas A continues to pass through the pipeline 10. In the present invention, the step of flowing the carrier gas A through the first path P1 and flowing out from the outlet E is called the pipeline cleaning step C. Compared with the prior art, the carrier gas A (that is, the carrier gas without material particles) continuously flows in the pipeline even in the non-deposition step, so that the possibility of material particles depositing in the gas pipeline can be reduced.

Then, as shown in FIG. 2, a deposition step d is performed, in which a plurality of valve switches (e.g., valve switches 40A, 40B, 40C, 40D, 40E) are switched to communicate with each other between the pipeline 10 and the chamber 20, and the carrier gas A travels along a second path P2, wherein the second path P2 passes through the material tank 30, and the carrier gas A is converted into a deposition gas B which reaches the chamber 20, the first wafer W1 is deposited, and a first material layer 50 is formed on the first wafer W1.

Here, the positions of various valve switches in this embodiment are defined. As shown in FIG. 1 and FIG. 2, valve switch 40A is connected to the inlet of material tank 30, valve switch 40B is connected to the outlet of material tank 30, valve switch 40C is connected to the pipeline branch located beside material tank 30, valve switch 40D is connected to the chamber 20, and valve switch 40E is connected to the outlet of pipeline. When the gas travels along the first path P1, the representative valve switches 40C, 40E are opened (i.e., the gas can flow through), while the valve switches 40A, 40B, 40D are closed (i.e., the gas cannot flow through). On the other hand, when the gas travels along the second path P2, the representative valve switches 40C and 40E are closed, while the valve switches 40A, 40B and 40D are open.

In this embodiment, the material components contained in the material tank 30 are, for example, pentakis (dimethylamino) tantalum (PDMAT), which is also equal to the substances contained in the first material layer 50 and the substances contained in the deposition gas B. However, it can be understood that other suitable material gases can be contained in the material tank 30, without being limited by the PDMAT described here.

In this embodiment, the carrier gas A is, for example, an inert gas including helium (He), neon (Ne), argon (Ar), krypton (Kr), xenon (Xe), radon (Rn), etc. In this embodiment, argon (Ar) is taken as an example, but not limited to this. While the carrier gas A passing through the pipeline 10, the flow rate of the gas is preferably greater than 500 sccm, but the present invention is not limited thereto.

Since the first path P1 and the second path P2 share a part of the pipeline 10 (that is, the first path P1 and the second path P2 partially overlap), the inner wall of the pipeline can keep gas flowing continuously during the pipeline cleaning step C, thus reducing the possibility of material molecule precipitation.

In other embodiments of the present invention, the pipeline cleaning step C can also be performed at the step of other non-deposition steps, except that the aforementioned pre-deposition step. For example, in the process of material layer deposition, when the deposition is paused due to adjusting parameters, the pipeline cleaning step can be carried out; or when multiple material layers need to be deposited on the wafer, the pipeline cleaning step can be carried out in the spare time of changing materials; or when the deposition of one wafer is completed and the spare time between the deposition steps of the next wafer needs to be performed, the pipeline cleaning step can also be performed.

Figure 3:
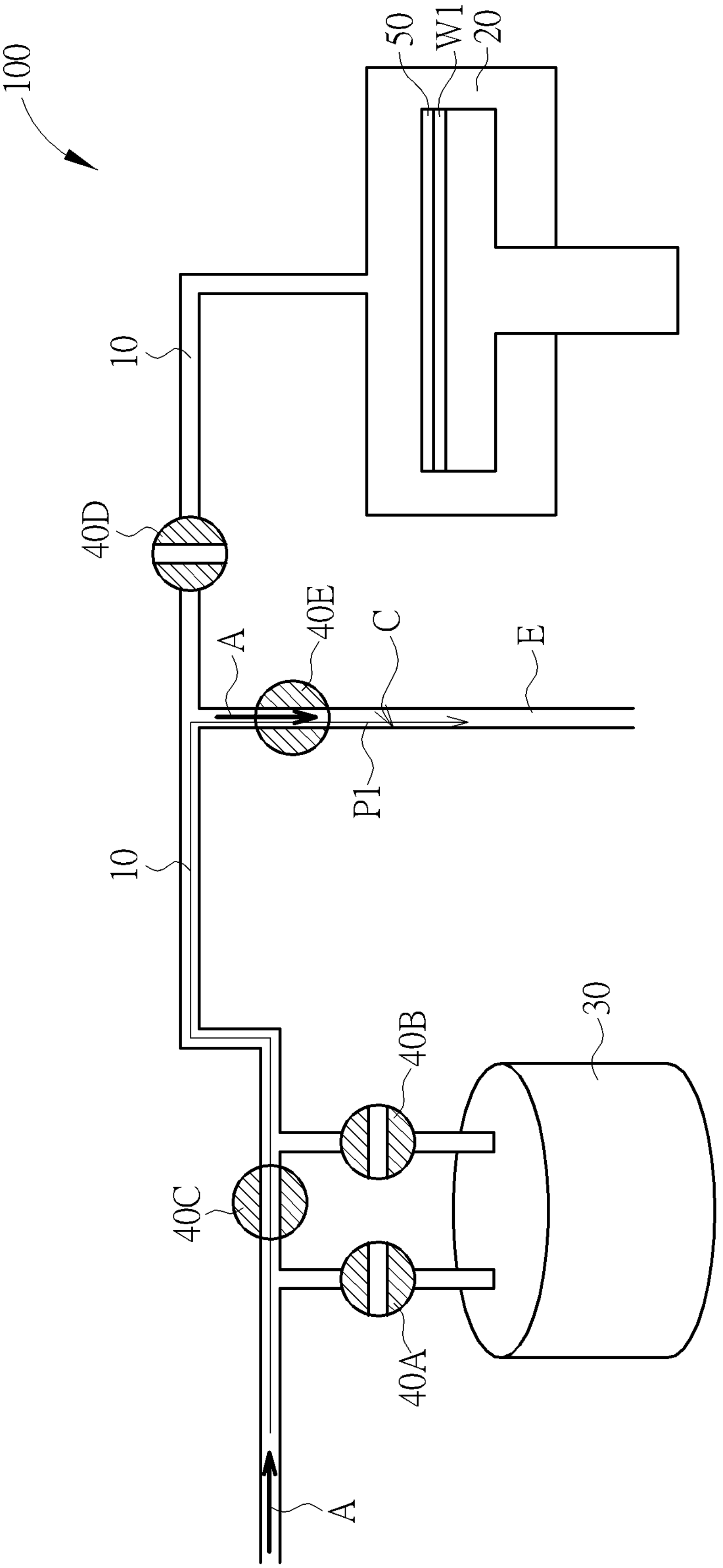
FIG. 3 is a schematic diagram showing a pipeline cleaning step in a deposition material replacement stage according to another embodiment of the present invention.

FIG. 3 is a schematic diagram showing a pipeline cleaning step in a deposition material replacement stage according to another embodiment of the present invention. As shown in FIG. 3, a first material layer 50 has been formed on the first wafer W1 after the deposition step D. At this time, a pipeline cleaning step C may be performed, which includes the steps of adjusting a plurality of valve switches 40A to 40E as shown in FIG. 1, so that the carrier gas A flows out of the outlet E through the first path P1.

Figure 4:
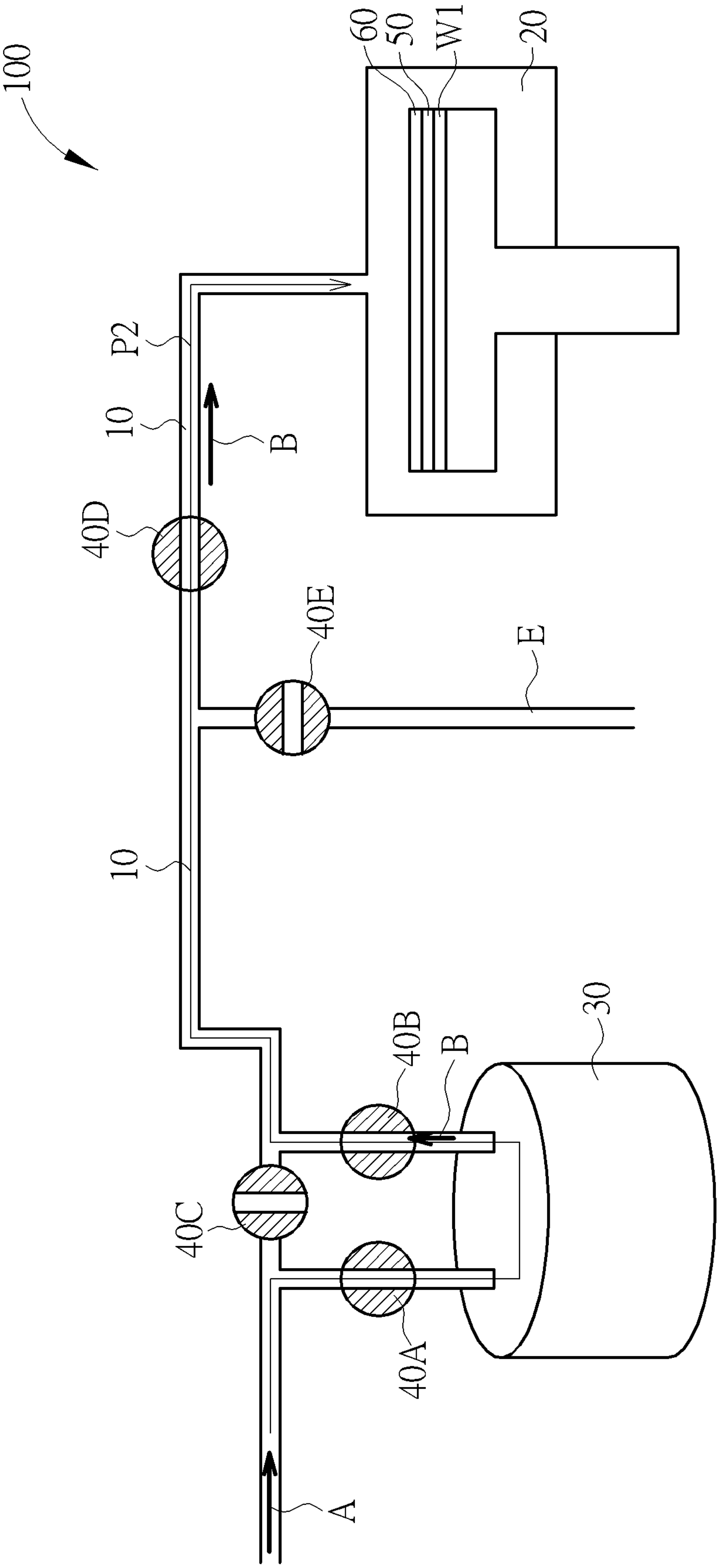
FIG. 4 is a schematic diagram showing a deposition step according to another embodiment of the present invention.

Then, as shown in FIG. 4, the deposition step D is performed again to deposit the second material layer 60 on the first wafer W1. In this embodiment, the second material layer 60 and the first material layer 50 comprise different materials. In the deposition step D, similar to the step described in FIG. 2, the material contained in the material tank 30 can be changed to change the deposition substance. That is to say, as shown in FIG. 3 and FIG. 4, the pipeline cleaning step can be performed in the spare time where the deposited material is changed.

In other embodiments of the present invention, the deposition of the first material layer 50 may be paused, and then the deposition of the first material layer 50 may be continued after adjusting the deposition parameters (such as temperature, pressure, etc.). The pipeline cleaning step C can also be carried out at the same time during the above-mentioned pause, and the above-mentioned features also fall within the scope of the present invention.

Figure 5:
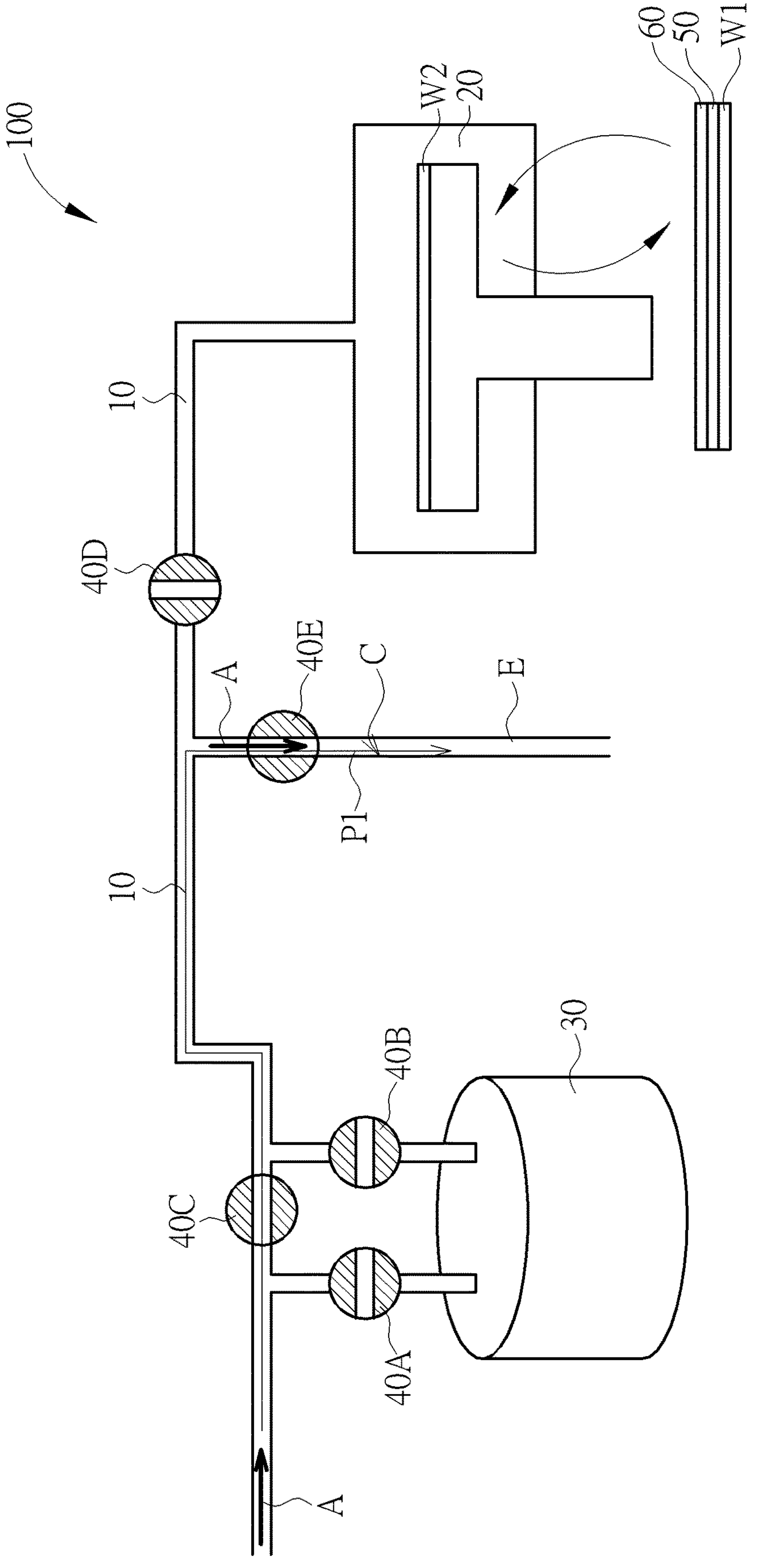
FIG. 5 is a schematic diagram showing a pipeline cleaning step in a wafer replacement stage according to another embodiment of the present invention.

FIG. 5 is a schematic diagram showing a pipeline cleaning step in a wafer replacement stage according to another embodiment of the present invention. As shown in FIG. 5, when the material layer on the first wafer W1 has been deposited, another wafer (e.g., the second wafer W2) can be replaced into the chamber 20 for the deposition step, for example, the first material layer 50 is also deposited on the surface of the second wafer W2. The above-mentioned pipeline cleaning step C can also be performed simultaneously in the spare time during the wafer replacement, and the above-mentioned features is also within to the scope of the present invention.

According to the above description and drawings, the present invention provides an improved semiconductor deposition method. The method at least includes the following steps: Firstly, a deposition machine 100 is provided, the deposition machine 100 comprises a chamber 20 connected with a pipeline 10. Next, a first wafer W1 is placed into the chamber 20, and a pipeline cleaning step C is performed. In the present invention, the pipeline cleaning step C comprises the following steps: closing a plurality of valve switches 40A, 40B, 40D to cut off the path between the pipeline 10 and the chamber 20, introducing a gas (carrier gas A) from the pipeline 10 to move along a first path P1 of the pipeline 10, and performing a deposition step D on the first wafer W1 to deposit a first material layer 50 on the surface of the first wafer W1. Besides, the deposition step D includes the following steps: opening a plurality of valve switches 40A, 40B and 40D to communicate the path between the pipeline 10 and the chamber 20, and introducing the gas into the chamber 20 along a second path P2 of the pipeline.

In some embodiments of the present invention, when the gas A moves along the first path P1, the carrier gas A does not contain the same composition as the first material layer 50.

In some embodiments of the present invention, when the gas moves along the second path P2, the deposition gas B contains the same composition as the first material layer 50.

Some embodiments of the present invention further include placing a second wafer W2 into the chamber 20, and performing a deposition step D to deposit the first material layer 50 on the surface of the second wafer W2.

In some embodiments of the present invention, in the step between depositing the first material layer 50 on the first wafer surface W1 and depositing the first material layer 50 on the second wafer W2, the pipeline cleaning step C is performed.

In some embodiments of the present invention, after the first wafer W1 is placed into the chamber 20 and before depositing the first material layer 50 on the surface of the first wafer W1, a pre-deposition step is performed and a pipeline cleaning step C is performed at the same time.

In some embodiments of the present invention, the pre-deposition step includes a vacuum step and a heating step.

In some embodiments of the present invention, the gas contains inert gas.

In some embodiments of the present invention, the flow rate of the gas is greater than 500 sccm.

In some embodiments of the present invention, the first material layer 50 comprises pentakis (dimethyl amino) tantalum (PDMAT).

In some embodiments of the present invention, a material tank 30 is further included, in which the PDMAT gas is contained, and the second path P2 passes through the material tank 30.

In some embodiments of the present invention, the first path P1 does not pass through the material tank 30.

In some embodiments of the present invention, the first path P1 and the second path P2 share a part of the pipeline.

Some embodiments of the present invention further include depositing a second material layer 60 on the first wafer W1 after depositing the first material layer 50 on the first wafer W1.

In some embodiments of the present invention, after the first material layer 50 is deposited and before the second material layer 60 is deposited, a pipeline cleaning step C is further included.

Some embodiments of the present invention further include pausing the deposition step and adjusting the parameters of the deposition step after depositing a part of the first material layer 50 on the first wafer W1, then continuing the deposition step to deposit the first material layer 50 on the first wafer W1.

In some embodiments of the present invention, the pipeline cleaning step C is performed simultaneously during the pause of the deposition step.

In the prior art, if the deposition step is not carried out, no gas passes through the pipeline, which leads to the issue that material particles in the gas are easily deposited in the pipe wall, causing accumulation pollution and the like. The invention is characterized in that the carrier gas without containing material particles continuously flows through the pipeline by switching the valve switch in the process spare times except the deposition step (including the pre-deposition step, pausing the deposition step by adjusting parameters, or changing wafers), so that the material particles are not easily deposited in the pipeline, and the cleaning time can be saved. The method can improve the process yield and the process efficiency, and is also compatible with the existing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An improved semiconductor deposition method, comprising:

providing a deposition machine, wherein the deposition machine comprises a chamber connected with a pipeline and a material tank;

placing a first wafer into the chamber, and a pipeline cleaning step is performed, wherein the pipeline cleaning step comprises:

closing a plurality of valve switches to cut off the path between the pipeline and the chamber; and introducing a carrier gas from the pipeline to make the carrier gas move along a first path of the pipeline, wherein the first path does not pass through the material tank; and performing a deposition step on the first wafer to deposit a first material layer on the surface of the first wafer, wherein the deposition step comprises:

communicating the path between the pipeline and the chamber by opening the plurality of valve switches; and switching the carrier gas to move along a second path to the chamber, wherein the second path passes through the material tank to introduce a deposition gas into the chamber;

wherein the carrier gas is continuously introduced into the pipeline during both the pipeline cleaning step and the deposition step to maintain a constant flow within the pipeline.

2. The method according to claim 1, wherein when the gas moves along the first path, the gas does not contain the same composition as the first material layer.

3. The method according to claim 1, wherein when the gas moves along the second path, the gas contains the same composition as the first material layer.

4. The method according to claim 1, further comprising placing a second wafer into the chamber and performing the deposition step to deposit the first material layer on the surface of the second wafer.

5. The method according to claim 4, wherein the pipeline cleaning step is performed in the step between depositing the first material layer on the first wafer surface and depositing the first material layer on the second wafer surface.

6. The method according to claim 1, after the first wafer is placed into the chamber and before the first material layer is deposited on the surface of the first wafer, a pre-deposition step is performed and the pipeline cleaning step is performed at the same time.

7. The method according to claim 6, wherein the pre-deposition step comprises a vacuum step and a heating step.

8. The method according to claim 1, wherein the gas contains inert gas.

9. The method according to claim 1, wherein the flow rate of the gas is greater than 500 sccm.

10. The method according to claim 1, wherein the first material layer comprises pentakis (dimethyl amine) tantalum (PDMAT).

11. The method according to claim 10, further comprising a material tank containing the PDMAT gas, and the second path passes through the material tank.

12. The method according to claim 11, wherein the first path does not pass through the material tank.

13. The method according to claim 1, wherein the first path and the second path share a part of the pipeline.

14. The method according to claim 1, further comprising:

after depositing the first material layer on the first wafer, a second material layer is deposited on the first wafer.

15. The method according to claim 14, wherein after the first material layer is deposited and before the second material layer is deposited, the pipeline cleaning step is further performed.

16. The method according to claim 1, further comprising:

after depositing a part of the first material layer on the first wafer, the deposition step is paused, the parameters of the deposition step are adjusted, and then continue the deposition step to deposit the first material layer on the first wafer.

17. The method according to claim 16, wherein the pipeline cleaning step is performed simultaneously during the deposition step is paused.

* * * * *